(12) United States Patent
Huang et al.

(10) Patent No.: US 7,274,009 B2
(45) Date of Patent: Sep. 25, 2007

(54) FRAME-SHUTTERED CMOS IMAGE SENSOR WITH SIMULTANEOUS ARRAY READOUT

(76) Inventors: Steven Lei Huang, 1117 Fairview Ave., Unit #C, Arcadia, CA (US) 91007; Daniel Alan Van Blerkom, 1810 Harding Ave., Altadena, CA (US) 91001

( * ) Notice: Subject to any disclaimer, the term of this patent is extended or adjusted under 35 U.S.C. 154(b) by 16 days.

(21) Appl. No.: 10/900,933

(22) Filed: Jul. 27, 2004

(65) Prior Publication Data

US 2005/0023437 A1    Feb. 3, 2005

Related U.S. Application Data

(60) Provisional application No. 60/481,149, filed on Jul. 28, 2003.

(51) Int. Cl.
    *H01J 1/42*      (2006.01)
    *H01J 40/14*     (2006.01)
    *H01L 31/00*     (2006.01)
    *H01L 31/062*    (2006.01)
    *H04N 3/14*      (2006.01)

(52) U.S. Cl. ............... 250/208.1; 250/214 R; 250/214.1; 348/30

(58) Field of Classification Search ............ 250/208.1, 250/214.1, 214 R; 348/308, 310, 300; 257/292
    See application file for complete search history.

(56) References Cited

U.S. PATENT DOCUMENTS 5,614,744 A * 3/1997 Merrill .................. 257/291
6,753,912 B1 * 6/2004 Wayne .................. 348/241
6,803,958 B1 * 10/2004 Wang .................... 348/308
6,917,027 B2 * 7/2005 Krymski ............... 250/208.1

* cited by examiner

*Primary Examiner*—Georgia Epps
*Assistant Examiner*—Don Williams
(74) *Attorney, Agent, or Firm*—John R. Ross; John R. Ross, III

(57) ABSTRACT

A frame shuttered CMOS image sensor with simultaneous array readout. An array of CMOS pixels are printed on a silicon substrate. Within each pixel is a light sensitive region comprising a photo sensitive diode for converting photons into electrical charge and at least three transistors to permit reading of reset electrical charges and collected electrical charges and for re-setting the photosensitive diode. The sensor includes an array of signal and re-set readout capacitors located on the substrate but outside of the pixel array. Metal conductors printed in said substrate connect each pixel in said pixel array with a signal capacitor and a re-set capacitor in array of signal and re-set readout capacitors. Transistor switches printed in said substrate but outside of said pixel array are used to isolate the signal and re-set capacitors from each other and from the pixels. Control circuitry is provided for re-setting simultaneously each of the pixels in the pixel array, for collecting simultaneously re-set signals from each pixel on to one of the reset capacitors in the array of readout capacitors and for collecting simultaneously integrated pixel signals from each pixel on to one of the signal capacitors in the array of readout capacitors. Readout circuitry is provided for reading charges collected on the array of signal and re-set capacitors.

5 Claims, 5 Drawing Sheets

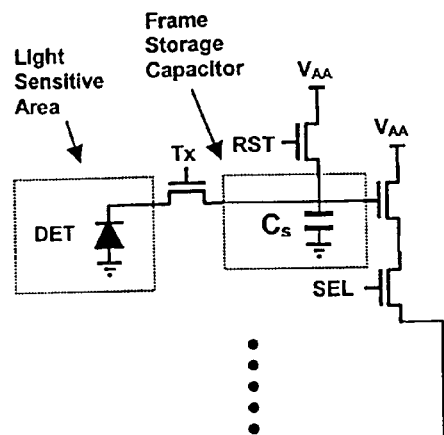
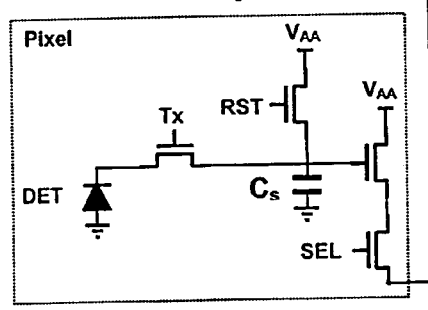
FIG. 3A
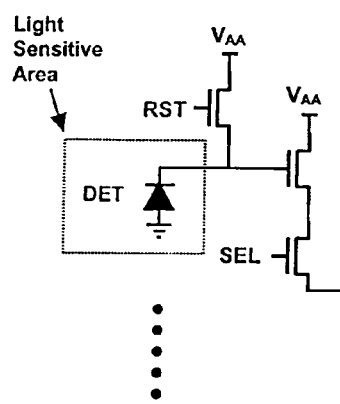
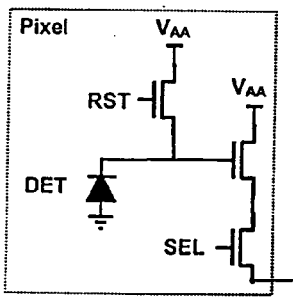
FIG. 3B

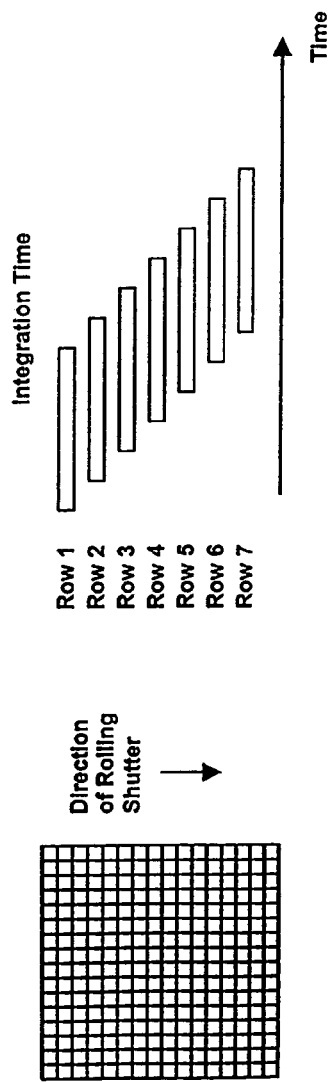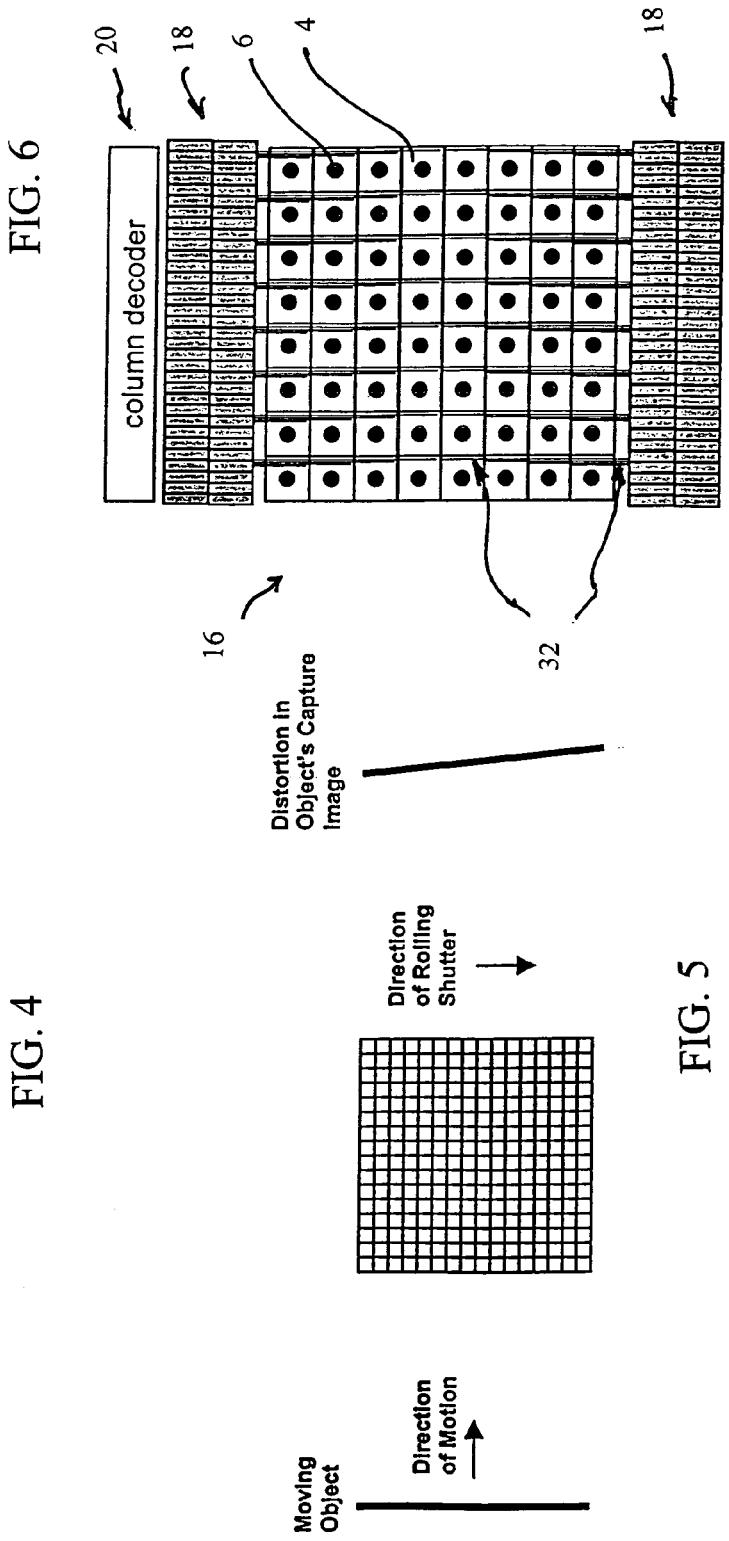

FRAME-SHUTTERED CMOS IMAGE SENSOR WITH SIMULTANEOUS ARRAY READOUT

This application claims the benefit of provisional Application, Ser. No. 60/481,149, filed Jul. 28, 2003. This invention relates to CMOS image sensors and in particular to high-speed array readout CMOS image sensors.

BACKGROUND OF THE INVENTION

Until recently, charge-coupled devices (CCD's) were the only image sensors widely used in digital imaging. They have been well developed through their use in astronomical telescopes, scanners, and video camcorders. However, CMOS image sensors promises to eventually become the image sensor of choice in a large segment of the digital imaging market. Both CCD and CMOS image sensors capture light on a grid of small pixels on their surfaces. It's how they process the image and how they are manufactured where they differ from one another. CCD Image Sensors CCD's got their name from the way the charges on the pixels are read after an exposure. After the exposure the charges on the first row are transferred to a place on the sensor called the read out register. From there, the signals are fed to an amplifier and then on to an analog-to-digital converter. Once the row has been read, its charges on the readout register row are deleted, the next row enters, and all of the rows above march down one row. The charges on each row are "coupled" to those on the row above so when one moves down, the next moves down to fill its old space. In this way, each row can be read-one row at a time.

CMOS Image Sensors

Image sensors are fabricated in factories called wafer foundries or "fabs" where the tiny circuits and devices are etched onto silicon chips. The biggest problem with CCD's is that there aren't enough economies of scale. They are created in foundries using specialized and expensive processes that can only be used to make other CCD's. Meanwhile, more and larger foundries across the street are using a different process called Complementary Metal Oxide Semiconductor (CMOS) to make millions of chips for computer processors and memory. CMOS is by far the most common and highest yielding chip-making process in the world. The latest CMOS processors, such as the Pentium II, contain almost 10 million active elements. Using this same process and the same equipment to manufacturer CMOS image sensors cuts costs dramatically because the fixed costs of the plant are spread over a much larger number of devices. As a result of these economies of scale, the cost of fabricating a CMOS wafer is one-third the cost of fabricating a similar wafer using a specialized CCD process. Costs are lowered even farther because CMOS image sensors can have processing circuits created on the same chip. When CCD's are used, these processing circuits must be on separate chips. Early versions of CMOS image sensors were plagued with noise problems, and used mainly in low-cost cameras. However, great advances have been made and CMOS image sensors with quality comparable to CCD's are used in some of the finest cameras.

High Speed Imaging

There are many applications of digital imaging devices where high-speed imaging is required. One such application is the optical sensor in an optical mouse for use with personal computers and video games. CMOS image sensors traditionally utilize two principal schemes for capturing and reading out a full frame of pixel data, the "pixel shutter" or the "rolling shutter".

The Pixel Shutter

In the pixel-shutter scheme, the entire array of pixels is reset simultaneously. After the given integration time, the collected charge in each pixel is transferred to in-pixel capacitors simultaneously and the entire array is reset again. These in-pixel capacitors are shielded from light. The integration time is effectively stopped at the time of the transfer. The sequential readout of the stored pixel values can then occur on a row-by-row basis, in parallel with the integration of the next frame of data. FIG. 1 shows the major components of a typical pixel-shuttered pixel array 2. For this example, the array size is 8×8 pixels 4. FIG. 3A shows one possible structure for such a pixel. Note by reference to FIG. 1 that the pixel storage capacitor 6 is located within the pixel region along with the pixel photodiode 8. Signal and reset capacitors 10 are located at the edge of the array. This scheme has several drawbacks:

1) Charge transfer—it is difficult to do an efficient and noiseless charge transfer from the photo-sensing node to the storage capacitor in a fabrication process not specially modified for image sensor applications. With the components available in typical prior art arrays, the charge must be shared between the detection node and storage node during read out. A significant part of the signal charge is lost during this process.

2) Readout noise—The use of the storage node as a shutter precludes the use of correlated double sampling (CDS) in this readout method. In CDS, a reference signal is stored in the storage node. By comparing this reference to the signal value, the pixel readout noise is significantly reduces. However, CDS is not compatible with a pixel shutter.

3) Reduction in input signal—the in-pixel capacitor, which is opaque, reduces the overall pixel area dedicated to the collection of light.

Rolling Shutter

The second scheme uses a "rolling shutter" to remove the need for the storage capacitors in each pixel. In this scheme, each pixel 4 in the array 12 integrates for the same amount of time, but the start and stop time for each row is staggered so that only one row of data needs to be buffered at a time as indicated in FIG. 4. The analog pixel values for a row are transferred simultaneously to an array of paired capacitors, where the number of paired capacitors equals the number of columns, at the edge of the array. One capacitor of the pair stores the signal level from the pixel, and the other capacitor stores the reset level from the pixel. These capacitors are then read out sequentially and then the process continues with the next row in the array. FIG. 2 shows the major components of an array using the rolling shutter technique. FIG. 3B shows one possible structure for such a pixel.

This rolling shutter scheme suffers from several drawbacks:

1) Image blur—the movement in the scene is seen differently by each row in the array, since each row has a different integration start and stop time as indicated in FIG. 4. For example, if the sensor is moving sideways with respect to a vertical bar, the bar will appear bent in the image due to the staggered integration times of each row. FIG. 5 shows this image artifact.

2) Power consumption—to reduce the effects of image blur, the frame rate for a rolling shutter sensor must be greatly increased. The higher frame rate significantly increases the power consumption of the sensor.

3) Readout noise—the kTC noise from the reset operation of the pixel is not cancelled, because the reset that starts the integration is not the same as the reset used to subtract from the signal level.

Sensor Performance Values

High-speed sensor performance in many cases involves consideration of and possible tradeoffs of four important performance values: minimal image blurring, low power consumption, reduction of noise and low cost of fabrication.

Minimal Image Blurring

The most critical problem faced by an image sensor in recording high-speed motion is that of image blur. The effective shutter speed of the image sensor must be significantly faster than the motion of the object it is imaging to produce an accurate image. Otherwise, the same point on the object may appear over multiple pixels in the image sensor. Alternatively, the relative position of the points on an object may appear shifted with respect to each other in a reproduced image.

Power Consumption

In applications such as the optical mouse, it is important that the power consumption of components to be minimized. In the case of tethered applications, the power is supplied from the host to the mouse. In these applications, the available power is typically quite limited by the interface standard. In wireless applications, a battery typically supplies the mouse's power. In these applications, it is extremely desirable for the battery life to be extended as long as possible.

Readout Noise

In an optical mouse, a light source [typically an light emitting diode (LED)] is used to illuminate the object. The optical signal form this source must be strong enough to produce a signal well above the noise floor of the image sensor for accurate image reproduction. However, the illumination sources output can not be increased without increasing the power consumption of the system. Therefore the best approach is to minimize the noise floor of the image sensor.

Low Cost Silicon Fabrication Process

The optical mouse is used in extremely cost sensitive markets. Therefore, it is critical that it be manufactured in a low cost fabrication process. This almost always means a process that was originally developed for digital circuitry (nominal process) and which does not have special provisions for image sensor applications (image sensor process).

In the previous state of the art, the above four performance values had to be traded off against each other. What is needed is an image sensor that simultaneously optimizes the above values.

SUMMARY OF THE INVENTION

The present invention provides a frame shuttered CMOS image sensor with simultaneous array readout. An array of CMOS pixels are printed on a silicon substrate. Within each pixel is a light sensitive region comprising a photo sensitive diode for converting photons into electrical charge and at least three transistors to permit reading of reset electrical charges and collected electrical charges and for re-setting the photosensitive diode. The sensor includes an array of signal and re-set readout capacitors located on the substrate but outside of the pixel array. Metal conductors printed in said substrate connect each pixel in said pixel array with a signal capacitor and a re-set capacitor in array of signal and re-set readout capacitors. Transistor switches printed in said substrate but outside of said pixel array are used to isolate the signal and re-set capacitors from each other and from the pixels. Control circuitry is provided for re-setting simultaneously each of the pixels in the pixel array, for collecting simultaneously re-set signals from each pixel on to one of the reset capacitors in the array of readout capacitors and for collecting simultaneously integrated pixel signals from each pixel on to one of the signal capacitors in the array of readout capacitors. Readout circuitry is provided for reading charges collected on the array of signal and re-set capacitors.

This invention eliminates the drawbacks of the rolling shutter, while avoiding the use of the in-pixel capacitors of the pixel-shuttered approach. We call this invention the "Simultaneous Array Readout". In this invention, a larger number of he storage capacitors are brought to the edges of the array. Unlike the rolling shutter scheme, where the number of capacitor pairs is equal to the number of columns in the array, for Simultaneous Array Readout the number of capacitor pairs is equal to the number of pixels in the array. This allows the array to be read out in a fully parallel fashion, which enables the implementation of a full frame-shutter without the requirement for a pixel with in-pixel storage.

The present invention has the following benefits:

1) Minimal image blurring—The entire array is read out simultaneously, minimizing distortions in the image.

2) Low power consumption—The frame shuttering approach needs the minimum frame rate for a given application. It relies on the storage capacitors to set the shutter speed.

3) Low readout noise—Also, because the reset can be sampled for every pixel at the start of integration, the kTC noise in each pixel can be cancelled. The Simultaneous Array Readout scheme can thus implement true Correlated Double Sampling (CDS), unlike the rolling shutter scheme.

4) Use of low cost fabrication process—This invention can be (and has been) implemented in a low cost digital process.

An additional benefit of the Simultaneous Array Readout scheme is that there is no longer a requirement to address the array on a row-by-row basis. This means that there is no need for the row decoder logic present in both the frame-shutter and rolling-shutter schemes.

BRIEF DESCRIPTION OF THE DRAWINGS

FIGS. 3A and 3B show electrical schematics for the above prior art pixel arrays.

FIGS. 4 and 5 describe an effect of a prior art rolling shutter technique.

FIG. 6 shows a preferred pixel layout of and 8×8 version of the present invention.

DETAILED DESCRIPTION OF PREFERRED EMBODIMENTS

Simultaneous Array Readout

FIG. 6 shows a possible implementation of our Simultaneous Array Readout. This is an 8×8 pixel array 16 useful as a very high-speed, very low-cost optical sensor useful for applications such as the sensor in an optical mouse for a personal computer or a video game. Individual pixels are indicated at 4 and the pixel photodiode sensitive region is shown at 6. Preferred locations of signal readout and reset circuitry are shown at 18. Locations of column decoders are shown at 20.

Figure 1:
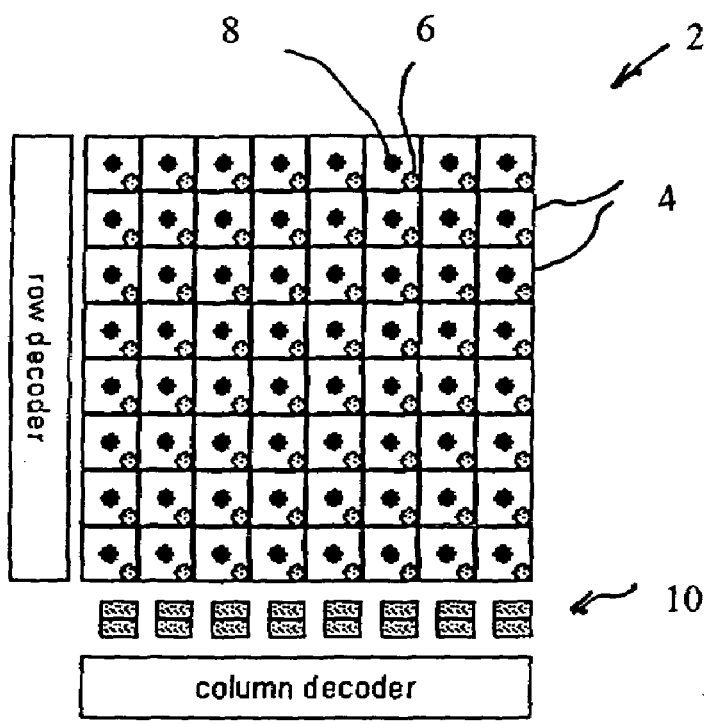
FIGS. 1 and 2 show typical prior art 8×8 pixel arrays.
Figure 2:
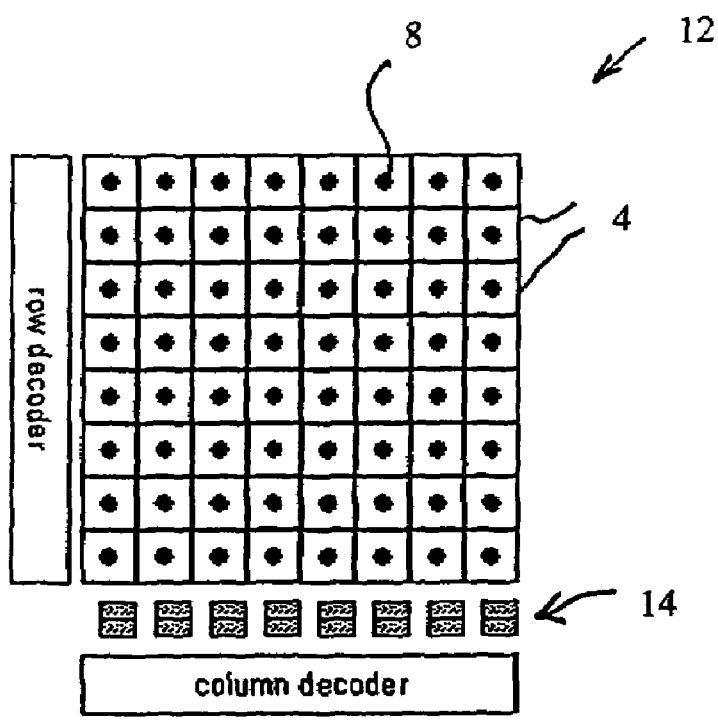
Figure 7:
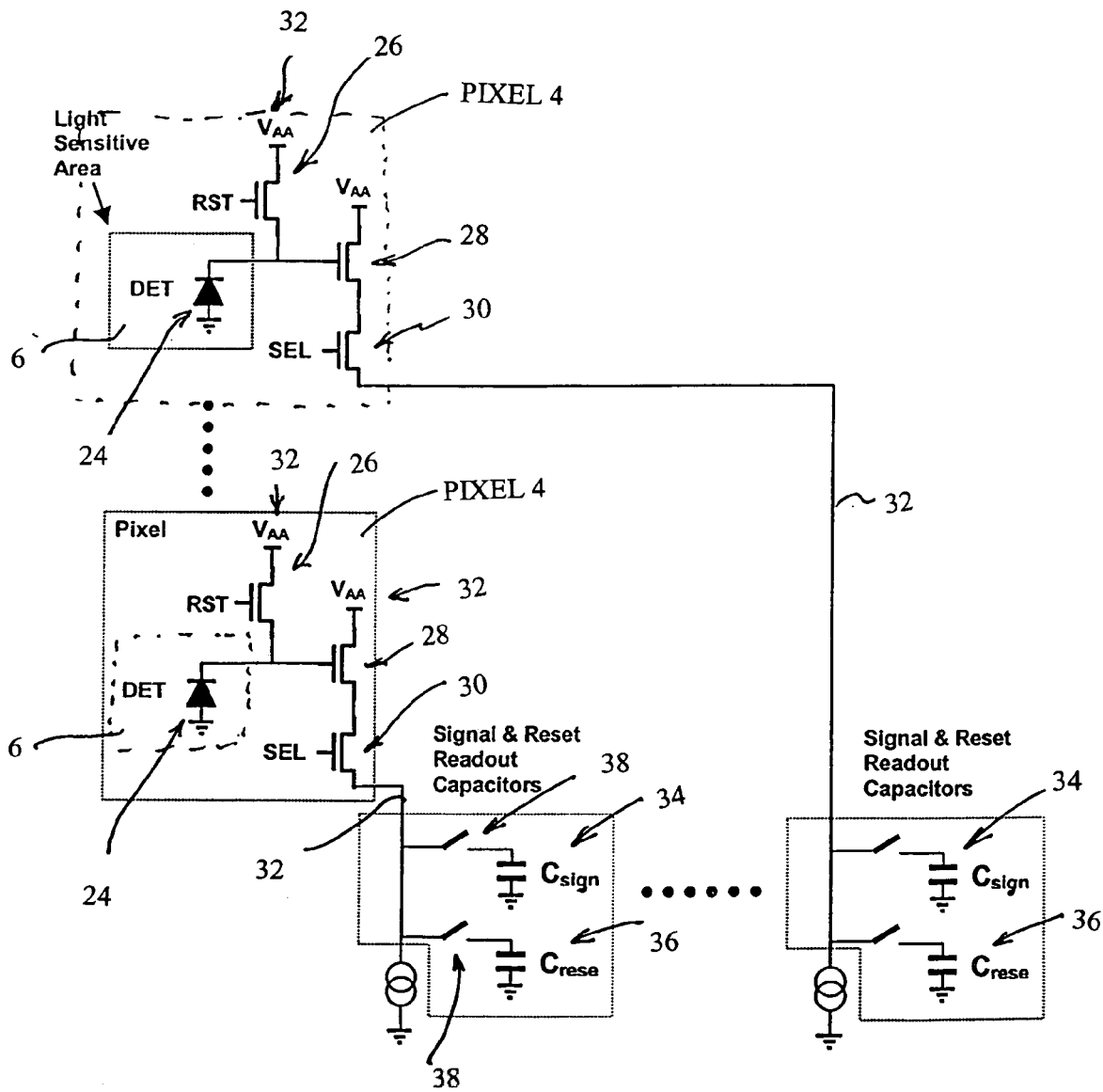
FIG. 7 shows an electrical schematic of the FIG. 6 pixel layout.

FIG. 7 shows a preferred implementation of this architecture in schematic form. For this example, an 8 by 8 pixel array 16 is indicated. Two pixels 4 of the array are shown in schematic detail and the other 62 pixels are represented by dots. Each pixel includes a light sensitive region 6 formed with a PIN diode junction 24. Each pixel also includes a reset transistor (RST) 26 that is operated by the application of a reset signal at the gate of the transistor to apply a reset voltage from supply $V_{AA}$ 32 to the pin diode junction 24. Each pixel also includes two additional transistors, (1) a source follower transistor 28 for which the charge on PIN diode junction 24 provides the gate voltage and (2) a selection transistor (SEL) 30 which is operated twice each cycle, first to read the reset voltage and second to read the signal voltage representing the charge collected by PIN diode 24 during the pixel integration period. As explained above the signal and reset storage capacitors 34 and 36 are located at the edge of the pixel array and connected to their respective pixels with metal wires 32 printed in the sensor. Transistor switches 38 and 40 located adjacent to the capacitors are operated to permit separate reading of the reset and signal currents. The source of these currents is supply voltage $V_{AA}$ at 32. As shown in FIG. 6, capacitor pairs are at both the top and bottom edges of the array. Metal wires 32 connect each pixel in the bottom half of the array to a capacitor pair at the bottom edge. Wires also connect each pixel in the top half of the array to a capacitor pair at the top edge.

Figure 8A:
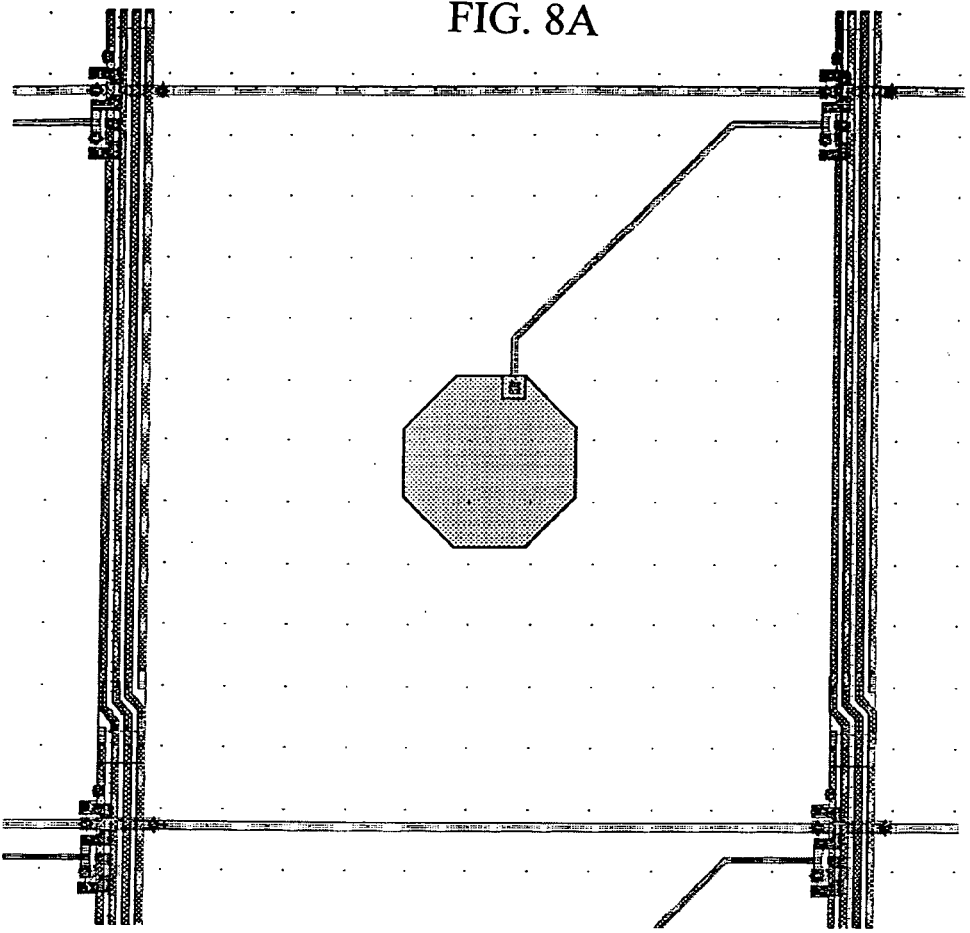
FIGS. 8A and 8B are views of a pixel.
Figure 8B:
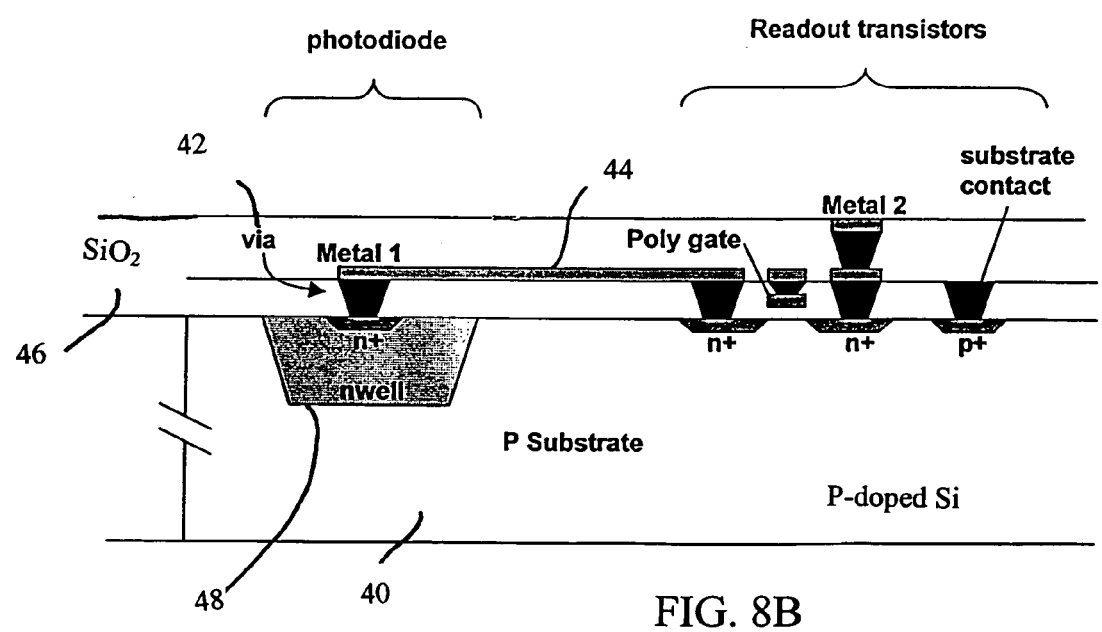

FIGS. 8A and 8B show the layout of a pixel of the above preferred embodiment. FIG. 8A is a top view of the pixel showing the locations and relative sizes of the three readout transistors in the pixel and the photodiode in the center of the pixel. FIG. 8B is a cross section view of elements of the pixel. The photodiode is an n-well type device. The p-substrate 40 is at ground. A potential is created between via 42 (functioning as a cathode) and p-substrate 40 when supply voltage is applied to metal conductor 44. Photons pass through transparent $SiO_2$ layers 46 and are absorbed in and around n-well 48 producing electron-hole pairs that discharge the cathode 42 during integration periods.

Operation

Operation of the Simultaneous Array Readout is as follows. To initiate integration, all of the pixels are reset simultaneously. Each pixel's reset value is sampled into the corresponding reset capacitor at the edge of the array simultaneously. After the integration time has passed, the signal output from each pixel is sampled onto the corresponding signal capacitor at the edge of the array simultaneously. The values in the capacitors can then be read out in a sequential fashion, producing an analog output that can be gained and/or digitized with an ADC.

In order to allow for overlapping the data output with pixel integration, while keeping the ability to cancel the kTC noise, two reset capacitors can be used for each pixel. The reset capacitors storing the reset values for the currently integrating frame and the reset capacitors storing the reset values for the frame currently being output can be switched back and forth, i.e. in Ping-Pong fashion, for each successive frame.

Metal Routing

One difficulty with implementing the fully parallel array readout is the amount of metal routing required in the array to bring the internal pixels out to the edge capacitors. In the rolling shutter scheme a single metal column line is shared by all the pixels in the column in a time-multiplexed fashion. In the parallel array readout scheme we propose, each pixel must have a dedicated metal line to the edge of the array. Another difficulty is that the capacitor pitch must be tighter, which means the capacitors must be longer if the same capacitance value is desired. By using more than one edge of the array, these difficulties can be reduced somewhat. Also, more advanced CMOS process technology allows for smaller capacitors and more metal routing in a given area.

Optical Mouse

A preferred application of the presented invention is as the image sensor in an optical mouse system. The mouse is a critical data entry tool in all modern personal computers and electronic game consoles. The optical mouse was developed as an improvement to the mechanical mouse. Compared to the mechanical mouse, the optical mouse contains no moving parts, which means high reliability and less maintenance for the end user.

An optical mouse system measures changes in position by optically acquiring sequential surface images (frames) and mathematically determining the direction and magnitude of movement. The image sensor acquires microscopic surface images via a lens and illumination system. A digital signal processor determines the direction and distance of motion by processing these images. This information is then transferred to a PC or game controller using an interface such as USB or a wireless interface (such as Bluetooth).

An image sensor in an optical mouse application must be capable of sensing high-speed mouse motion—in the form of direction, velocity, and acceleration—for increased user precision and smoothness. To do this as discussed in the Background Section, an image sensor must have the following characteristics: minimal image blurring, low power consumption, reduction of noise and low cost of fabrication.

In prior art sensors, the above 4 requirements had to be traded off against each other. This invention simultaneously optimizes the above requirements. Frame rates can be extremely fast [how fast?], very little power is needed for the electronics and the light [how little?], noise is minimized [can we quantitify?] and the cost of the circuit at high production is estimated to be only a few cents per sensor array.

While the present invention is described above in terms of preferred embodiments, persons skilled in the are will recognize that many changes and modifications could be made without departing for the spirit of the invention. For example, the array size could be smaller or much larger than the 8×8 array described. However, where frame speed in important reading out with more than about 156 pixels could be difficult. Also as the pixel number increases conducting the signals out to the readout capacitors becomes more difficult. Signal and reset capacitors could be located at four edges instead of only two. The sensor could be applied to many applications in addition to the optical mouse, especially other applications requiring high frame rates. Therefore, the reader should determine the scope of the invention by the appended claims and their legal equivalents and not by the examples given above.

We claim:

1. A frame shuttered CMOS image sensor with simultaneous array readout comprising:

A) an array of CMOS pixels printed on a silicon substrate, said array defining outside edges, with each pixel comprising:
   1) a light sensitive region comprising a photo sensitive diode for converting photons into electrical charge,
   2) at least three transistors to permit reading of collected electrical charge for re-setting said photosensitive diode at a re-set charge, and to permit reading of the re-set charge, B) an array of signal and re-set readout capacitors located on said substrate but outside of said pixel array but near at least one of the outside edges, said array of capacitors including one signal capacitor and one re-set readout capacitor for each pixel, C) a plurality of metal conductors printed in said substrate for connecting each pixel in said pixel array with a signal capacitor and a re-set capacitor in said array of signal and re-set readout capacitors, D) a plurality of transistor switches printed in said substrate but outside of said pixel array for isolating said signal and re-set capacitors from each other and from said pixels, E) control circuitry for re-setting simultaneously each of said pixels in said pixel array, for collecting simultaneously re-set signals from each pixel in said pixel array on one of the reset capacitors in said array of readout capacitors and for collecting simultaneously integrated pixel signals from each pixel in said pixel array on one of the signal capacitors in said array of readout capacitors, and F) readout circuitry for reading charges collected on said array of signal capacitors and said at least one array of re-set capacitors.

2. The sensor as in claim 1 wherein said control circuitry comprises circuitry for storing reset values for the currently integrating frame on one of the two re-set capacitors and for storing the reset values for the previous frame on the other capacitor.

3. The sensor as in claim 1 wherein said pixel array comprises 156 or fewer pixels.

4. The sensor as in claim 1 wherein said pixel array comprises 64 pixels.

5. The sensor as in claim 1 wherein said pixel array comprises and 8.times.8 array.

* * * * *